(12) United States Patent
Qin et al.

(10) Patent No.: US 8,716,090 B2
(45) Date of Patent: May 6, 2014

(54) SEMICONDUCTOR DEVICE MANUFACTURING METHOD

(75) Inventors: Changliang Qin, Beijing (CN); Huaxiang Yin, Beijing (CN)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 0 days.

(21) Appl. No.: 13/580,962

(22) PCT Filed: Jun. 12, 2012

(86) PCT No.: PCT/CN2012/000803
§ 371 (c)(1),
(2), (4) Date: Aug. 24, 2012

(87) PCT Pub. No.: WO2013/173944
PCT Pub. Date: Nov. 28, 2013

(65) Prior Publication Data
US 2013/0316509 A1 Nov. 28, 2013

(30) Foreign Application Priority Data
May 25, 2012 (CN) .......................... 2012 1 0168214

(51) Int. Cl.
*H01L 21/336* (2006.01)

(52) U.S. Cl.
USPC ................... 438/289; 257/408; 257/E21.634; 257/E21.619

(58) Field of Classification Search
CPC ............... H01L 21/82; H01L 21/8283; H01L 21/823814
USPC .................. 438/289, 283; 257/E21.218, 408, 257/E21.619, E21.634
See application file for complete search history.

(56) References Cited

U.S. PATENT DOCUMENTS

| | | | |
|---|---|---|---|
| 2002/0072176 A1* | 6/2002 | Park et al. ...................... | 438/286 |
| 2002/0074612 A1* | 6/2002 | Bulucea et al. ............... | 257/402 |
| 2005/0279992 A1* | 12/2005 | Gupta et al. ..................... | 257/24 |
| 2005/0285212 A1* | 12/2005 | Tolchinsky et al. ........... | 257/408 |
| 2006/0081925 A1* | 4/2006 | Wang et al. ..................... | 257/344 |
| 2007/0001199 A1* | 1/2007 | Shen et al. ..................... | 257/288 |
| 2007/0032003 A1* | 2/2007 | Zhang et al. .................. | 438/197 |
| 2007/0155142 A1 | 7/2007 | Jin | |

(Continued)

FOREIGN PATENT DOCUMENTS

| | | |
|---|---|---|
| CN | 101542699 A | 9/2009 |
| CN | 101572269 A | 11/2009 |
| CN | 102437118 A | 5/2012 |

*Primary Examiner* — Caridad Everhart
(74) *Attorney, Agent, or Firm* — Treasure IP Group, LLC

(57) ABSTRACT

The present invention provides a manufacturing method for a semiconductor device having epitaxial source/drain regions, in which a diffusion barrier layer of the source/drain regions made of epitaxial silicon-carbon or germanium silicon-carbon are added on the basis of epitaxially growing germanium-silicon of the source/drain regions in the prior art process, and the introduction of the diffusion barrier layer of the source/drain regions prevents diffusion of the dopant in the source/drain regions, thus mitigating the SCE and DIBL effect. The use of the diffusion barrier layer for the source/drain regions can also reduce the dosage of HALO implantation in the subsequent step, thus if HALO is performed before epitaxial growth of the source/drain regions, impact on the surfaces of the source/drain regions can be alleviated; if HALO is performed after epitaxial growth of the source/drain regions, the stress release effect of the epitaxial layer of the source drain/regions caused by the implantation can be reduced as much as possible.

20 Claims, 4 Drawing Sheets

(56) References Cited

U.S. PATENT DOCUMENTS

2009/0026552 A1    1/2009  Zhang
2011/0256681 A1*  10/2011  Lin et al. .................... 438/285
2012/0199849 A1*   8/2012  Tsai et al. .................... 257/77

* cited by examiner

SEMICONDUCTOR DEVICE MANUFACTURING METHOD

CROSS REFERENCE

This application is a National Stage Application of, and claims priority to, PCT Application No. PCT/CN2012/000803, filed on Jun. 12, 2012, entitled "Semiconductor Device Manufacturing Method", which claims priority to Chinese Application No. 201210168214.0, filed on May 25, 2012. Both the PCT application and the Chinese application are incorporated herein by reference in their entireties.

FIELD OF THE INVENTION

The present invention relates to a semiconductor device manufacturing method, in particular to a manufacturing method for a transistor having epitaxial source/drain regions.

BACKGROUND OF THE INVENTION

After semiconductor integrated circuit technology enters into technical node of 90 nm feature size, maintaining or improving transistor performance is becoming more and more challenging. In the current mainstream technology, the performance of PMOS is improved by epitaxially growing germanium-silicon in trenches of source/drain regions to provide a compressive stress to press the channel region of the transistor. Silicon-carbon is epitaxially grown in source/drain regions in order to improve the performance of NPMOS. Referring to FIG. 1, which shows a schematic drawing of a prior art transistor structure having epitaxial source/drain regions, trenches of the source/drain regions are formed by etching a substrate 1, and germanium-silicon or silicon-carbon is epitaxially grown to form epitaxial source/drain regions 2, thereby providing a stress to the channel region.

In devices with small size, boron (B) in source/drain regions of PMOS will easily diffuse from the source/drain regions into the substrate and channel region, causing SCE (Short Channel Effect) and DIBL (Drain Induction Barrier Lower) effects to increase the resistance of the source/drain regions and reducing the breakdown voltage between source and drain. In addition, if boron diffuses from source/drain extension regions into a gate insulating layer, the electrical properties of the gate insulating layer will become unstable. Meanwhile, the diffusion of boron from the source/drain regions will result in an increase of the electrons of the source/drain regions. All the above three aspects will degrade the electrical performance of the devices. The epitaxial germanium-silicon is doped with boron to reduce the serial resistance and the contact resistance, but boron with a high content in the epitaxial germanium-silicon might diffuse into the channel region. In PMOS, boron diffusing into the channel may result in a reduction of the threshold voltage in devices with small size.

In order to prevent diffusion of boron, the currently used method is HALO implantation. The implanted particles may be phosphor or arsenic, and the dosage is generally greater than $3e13cm^{-3}$. If the HALO implantation is performed before the epitaxial growth, the high dosage implantation may destroy the crystal structure at the surfaces of the source/drain trenches, thus influencing the subsequent epitaxial growth of germanium-silicon in the source/drain regions; if the implantation is performed after the epitaxial growth, the high dosage implantation will cause a release of the stress of the epitaxial layer, thus reducing the source/drain stress and weakening the effects of the source/drain stress suppressing SCE and DIBL. Meanwhile, a more profound influence is that even the HALO implantation cannot completely control the boron diffusion, and a short channel effect will occur. In addition, there is also a method at present, including implanting carbon ion into the source/drain silicon trenches as a barrier layer for preventing the boron diffusion, then performing a HALO implantation of a small dosage as a supplement for preventing the boron diffusion. This method can alleviate the damage to the surfaces of the source/drain silicon trenches caused by HALO, but it causes a new problem of damage to the source/drain silicon trenches by carbon implantation, meanwhile, in order to repair the damage to the surfaces of the source/drain trenches caused by the implantation, annealing is required in said process, which in turn results in a re-distribution of the doping element and makes the electrical properties of the device unstable. Therefore, there is a need for a new manufacturing method for a transistor having epitaxial source/drain regions to solve the above problems and to better ensure the good performance of the transistor.

SUMMARY OF THE INVENTION

The present invention provides a semiconductor device manufacturing method for manufacturing a transistor having epitaxially grown source/drain, said method prevents the diffusion of doping elements by epitaxially growing barrier layers in source/drain regions, thereby improving the device performance and stability. The method according to the present invention comprises:
providing a semiconductor substrate with an STI structure and performing a well region implantation;
forming a gate insulating layer and a gate to defining a gate pattern;
forming a dummy spacer covering a sidewall of the gate;
forming a trench in a source/drain region;
epitaxially growing a diffusion barrier layer in the source/drain region on a sidewall and a bottom of the trench;
epitaxially growing source/drain to provide stress to a channel region of the transistor;
performing a LDD doping, and performing a HALO process with a smaller dosage than that of a conventional HALO process;
forming a source/drain spacer;
performing annealing processing with respect to the epitaxially grown source/drain; and
forming metal silicides on the source/drain regions as contacts to the source/drain.

According to one aspect of the present invention, the diffusion barrier layer had a thickness of 1 Å-300 Å, preferably 10 Å-100 Å.

According to one aspect of the present invention, the diffusion barrier layer includes material of silicon-carbon (Si:C) or germanium silicon-carbon (SiGe:C); the carbon in the diffusion barrier layer has a doping concentration of $1e12$ $cm^{-3}$-$1e22cm^{-3}$, preferably $5e19$ $cm^{-3}$.

According to one aspect of the present invention, the diffusion barrier layer is formed by directly epitaxially growing silicon-carbon (Si:C) or germanium silicon-carbon (SiGe:C), or by growing an epitaxial silicon buffer layer first and then growing silicon-carbon (Si:C) or germanium silicon-carbon (SiGe:C).

According to one aspect of the present invention, the trenches are formed by dry etching, wet etching or a combination of both.

According to one aspect of the present invention, the gate includes a polysilicon material, and forming a gate insulating layer and a gate includes a gate-last process, namely, after forming the metal silicide, removing the gate of the polysilicon material to form a gate cavity that is filled with metal to form a metal gate.

According to one aspect of the present invention, forming a gate insulating layer and a gate includes a gate-first process, namely, the gate includes a metal material.

According to one aspect of the present invention, the semiconductor device manufacturing method is applicable to an integrated process of gate-first and gate-last of high-K/metal gate.

According to one aspect of the present invention, after forming the gate pattern and before epitaxially growing the source/drain, a LDD doping is performed, without performing a HALO process, or performing a HALO process with a smaller dosage than that of a conventional HALO process.

According to one aspect of the present invention, after epitaxially growing the source/drain and before forming the source/drain spacer, a LDD doping is performed, and a HALO process with a smaller dosage than that of a conventional HALO process is performed. Wherein before performing the LDD doping, the dummy spacer is removed and an offset spacer is formed, thereby defining a LDD region; or the dummy spacer is used to define the LDD region without being removed before performing the LDD doping. Wherein when a HALO process with a smaller dosage than that of a conventional HALO process is performed, the dosage of the HALO process performed is smaller than 1e13cm$^{-3}$.

According to one aspect of the present invention, the diffusion barrier layer is used for preventing diffusion of phosphor ions implanted into the source/drain region for a NMOS.

According to one aspect of the present invention, the diffusion barrier layer is used for preventing diffusion of boron ions implanted into the source/drain region for a PMOS.

The advantages of the present invention are to provide a manufacturing method for a semiconductor device having epitaxial source/drain regions, in which a diffusion barrier layer of the source/drain regions made of epitaxial silicon-carbon or germanium silicon-carbon are added on the basis of epitaxially growing germanium-silicon of the source/drain regions in the prior art process, and the introduction of the diffusion barrier layer of the source/drain regions prevents diffusion of the dopant in the source/drain regions, thus mitigating the SCE and DIBL effect. The use of the diffusion barrier layer for the source/drain regions can also reduce the dosage of HALO implantation in the subsequent step, thus if HALO is performed before epitaxial growth of the source/drain regions, impact on the surfaces of the source/drain regions can be alleviated; if HALO is performed after epitaxial growth of the source/drain regions, the stress release effect of the epitaxial layer of the source drain/regions caused by the implantation can be reduced as much as possible.

DETAILED DESCRIPTION OF THE PREFERRED EMBODIMENTS

The present invention will be described below by the specific embodiments shown in the figures. It shall be understood that these descriptions are exemplary and are not intended to limit the scope of the present invention. In addition, descriptions about the known structures and techniques are omitted so as not to unnecessarily confusing the concepts of the present invention.

The present invention provides a semiconductor device manufacturing method, in particular to a manufacturing method for a transistor having epitaxial source/drain regions, and the manufacturing process thereof is as shown in FIGS. 2-11.

Figure 1:
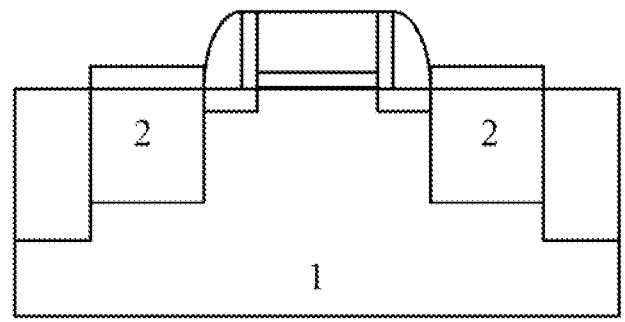
FIG. 1 is a schematic drawing of a prior art transistor structure having epitaxial source/drain regions.
Figure 2:
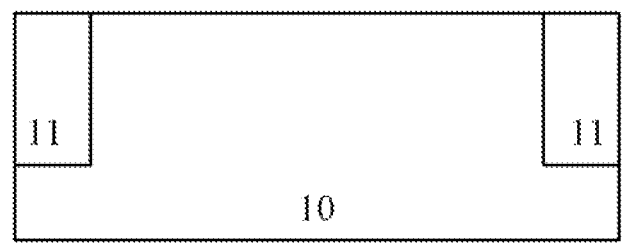
FIGS. 2-11 are schematic drawings of the flow of the manufacturing method for a transistor having epitaxial source/drain regions and epitaxial protection regions provided in the present invention.

Referring to FIG. 2 first, STIs (Shallow Trench isolation) 11 are formed in a semiconductor substrate 10 and well region implantation is performed. The semiconductor substrate 10 is monocrystalline silicon in this embodiment. Alternatively, an SOI substrate or other suitable semiconductor substrates can also be used. STIs 11 are formed in the semiconductor substrate 10 in such a manner that the semiconductor substrate 10 is coating with photoresist which is then patterned by photolithography, and the semiconductor substrate 10 are anisotropically etched to form shallow trenches, which are filled with a dielectric material such as $SiO_2$, for example, to form the STIs. After forming STIs 11, well region implantation (not shown) is performed. The dopant for PMOS well region implantation is of N-type, and the dopant for NMOS well region implantation is of P-type.

Figure 3:
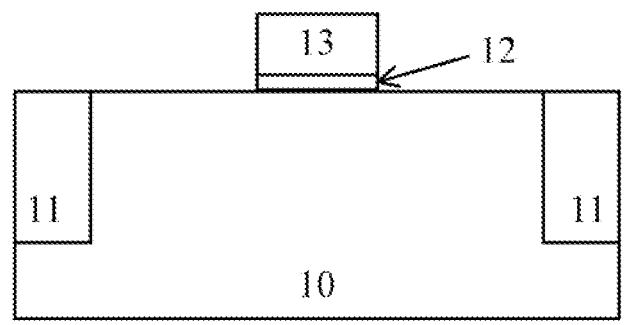

Next, a gate insulating layer 12 and a gate 13 are formed, as shown in FIG. 3. A layer of high-K gate insulating material thin film, which is advantageous to transistor device performance due to its higher dielectric constant than $SiO_2$, is deposited on the surface of the substrate 10 first. The high-K gate insulating material includes certain metal oxides, metal aluminates, etc., such as $HfO_2$, $ZrO_2$ and $LaAlO_3$. The gate insulating layer 12 with gate insulating property should be as thin as possible. The thickness thereof is preferably 0.5-10 nm. It is deposited by, for example, CVD. After forming the gate insulating layer 12, material for the gate 13 is deposited. In this embodiment, the material for the gate 13 is polysilicon. After depositing the gate material, photoresist is coated, and patterned by lithography, then the gate 13 and the gate insulating layer 12 are etched sequentially to form a gate pattern.

Figure 4:
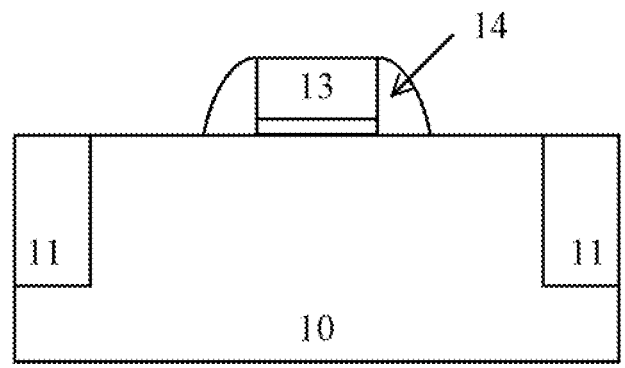

Then, dummy spacers 14 are formed as shown in FIG. 4. The dummy spacers 14 are used to define trenches for source/drain to be formed. A spacer material layer, such as $SiO_2$, $Si_3N_4$, is deposited on the substrate 10 by conformal deposition, so that it covers the gate 13 with a desired thickness. Next, parts of the spacer material layer on both the surface of the substrate 10 and the top of the gate 13 are removed by anisotropic etching, so that the spacer material layer remains only on the sidewalls of the gate 13 to form dummy spacers.

Figure 5:
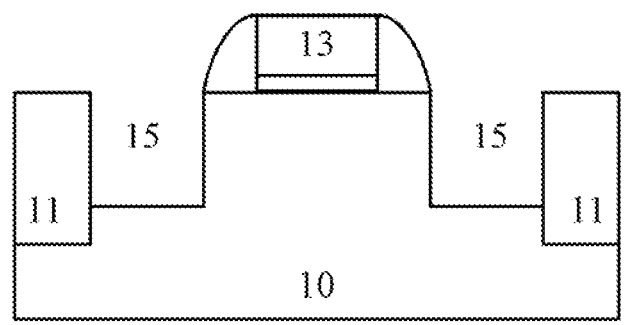

Then, trenches 15 are formed in the source/drain regions as shown in FIG. 5. In this embodiment, the substrate 10 is etched by dry etching, wet etching or a combination thereof, thereby forming the trenches 15 to accommodate an epitaxial layer.

Figure 6:
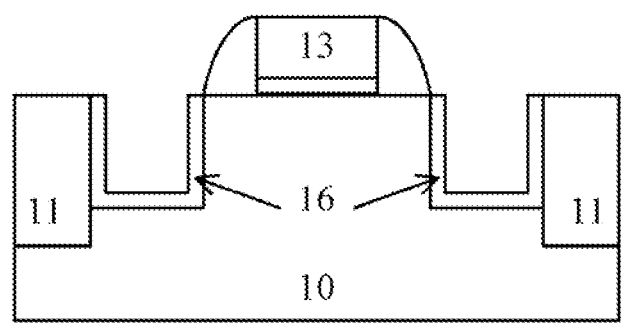

Then, a diffusion barrier layer 16 is selectively epitaxially grown in the source/drain regions as shown in FIG. 6. The material forming the diffusion barrier layer 16 comprises silicon-carbon (Si:C) or germanium silicon-carbon (SiGe:C). Silicon-carbon (Si:C) or germanium silicon-carbon (SiGe:C) can reduce diffusion of dopants (e.g. boron (B) and phosphor (P)) to be implanted into the source/drain regions, thus mitigating the SCE and DIBL effects and making the device performance more stable. Meanwhile, it can also prevent increase in the serial resistance and contact resistance in the source/drain regions caused by diffusion of dopants. Forming the diffusion barrier layer 16 by epitaxially growing silicon-carbon (Si:C) or germanium silicon-carbon (SiGe:C), with respect to by ion implantation, can not only avoid the damage caused by implantation, but also avoid re-distribution of the doping elements during annealing for repairing the crystal lattice damage when using the implantation method. Besides, a shallow junction may be formed by suppressing diffusion of the doping element of the source/drain extension regions, thereby avoiding reduction of the LDD effect and increase of the junction depth caused by diffusion of the doping element in the source/drain extension regions during annealing. More importantly, the use of the diffusion barrier layer 16 can help to reduce dosage of the HALO implantation in the subsequent step. Hence if HALO is performed before epitaxial growth of the source/region, influence to the surfaces of the source/drain regions can be reduced, and if HALO is performed after epitaxial growth of the source/region, the stress release effect of the source/drain epitaxial layer caused by implantation can be reduced to the greatest extent. The diffusion barrier layer 16 is formed on the sidewalls and bottom of the trenches 15. The thickness of the diffusion barrier layer 16 is determined according to the practical need, which is preferably 1 Å-300 Å, and preferably 10 Å-100 Å. The doping concentration of carbon is $1e12 cm^{-3}$-$1e22 cm^{-3}$, and preferably $5e19 cm^{-3}$. The diffusion barrier layer 16 can be formed by directly epitaxially growing silicon-carbon (Si:C) or germanium silicon-carbon (SiGe:C) in the trenches 15, or by growing an epitaxial silicon buffer layer first and then growing silicon-carbon (Si:C) or germanium silicon-carbon (SiGe:C).

Figure 7:
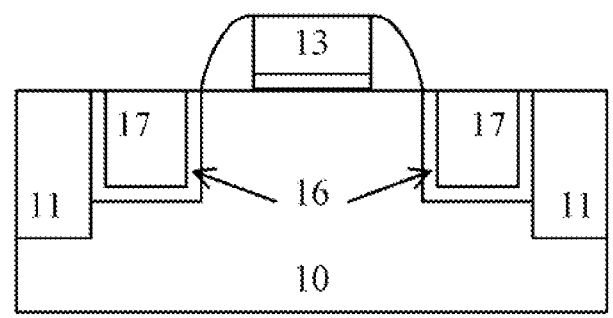

Subsequently, source/drain 17 are epitaxially grown selectively, as shown in FIG. 7. The material of the source/drain 17 is germanium-silicon SiGe for providing stress to the MOS channel region, thereby increasing the carrier mobility. The material for the source/drain 17 can be directly grown on the diffusion barrier layer 16, so that the diffusion barrier layer 16 surrounds the sides and bottom of the source/drain. During epitaxial growth, an in-situ doping of source/drain of the device, for example, using boron or phosphor, can be performed. With respect to PMOS, the source/drain 17 can provide a compressive stress, and with respect to the NMOS, the source/drain 17 can provide a tensile stress.

Figure 8:
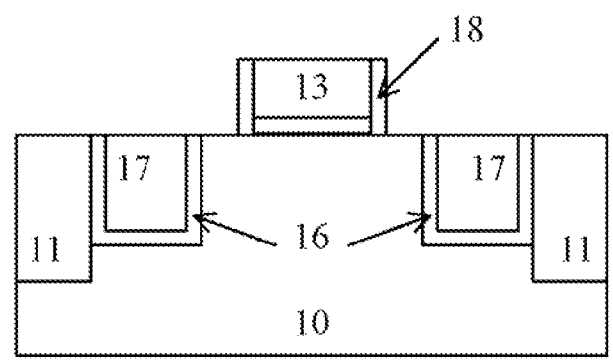

Next, the dummy spacers 14 are removed and offset spacers 18 are formed as shown in FIG. 8. The offset spacers are used for defining LDD regions. The method and material for forming the offset spacers are the same as those for forming the dummy spacers 14. Meanwhile, in another embodiment, the dummy spacers 14 may not be removed, but is directly used to act as the offset spacers, namely, using the dummy spacers 14 to define the LDD regions.

Figure 9:
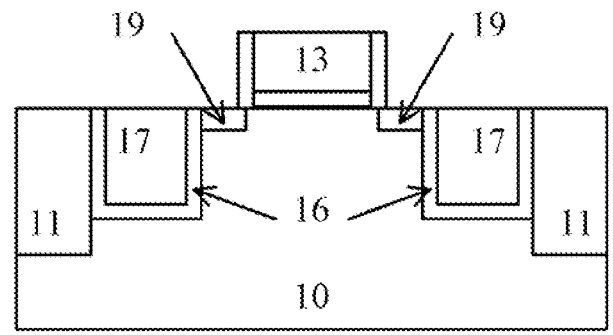

Then, a LDD doping process and a HALO process are performed to form LDD regions 19, as shown in FIG. 9. Owing to the existence of the diffusion barrier layer 16, a smaller implantation dosage is required for the HALO process in the present invention. For example, a conventional HALO implantation dosage is $3e13 cm^{-3}$, while the implantation dosage in the present invention is less than $1e13 cm^{-3}$. Thus the epitaxially grown source/drain 17 for providing stress is protected from releasing stress, and the effect of suppressing SCE and DIBL by the stress of the source/drain regions is ensured. Meanwhile, in another embodiment, the LDD doping and the HALO process can be performed after forming the gate pattern and before epitaxially growing the source/drain.

Figure 10:
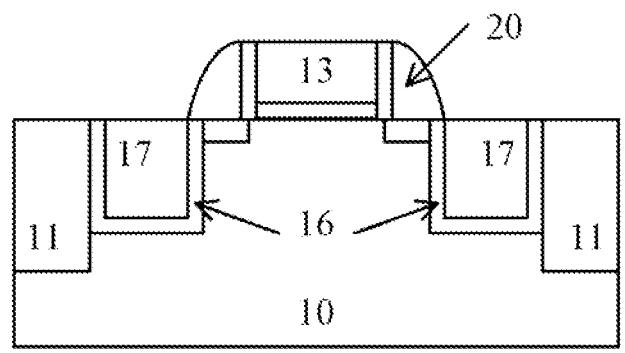

Then, source/drain spacers 20 are formed as shown in FIG. 10. The source/drain spacers (S/D spacers) are used for defining source/drain contact regions and are made of $SiO_2$, $Si_3N_4$ and a combination thereof The method of forming said source/drain spacers is the same as that for forming the dummy spacers 14. After forming the source/drain spacers 20, annealing is performed to the LDD and HALO implantation to complete source and drain of the MOS device.

It shall be noted that the process steps in FIGS. 7-10 can be adjusted according to the practical needs. For example, FIGS. 7-10 illustrates epitaxially growing the source/drain first, then forming the LDD regions and performing HALO implantation, and then doping the source/drain. Alternatively, it is also possible to first form the LDD regions and perform the HALO implantation, and then perform epitaxial growth of the source/drain and doping of the source/drain. Because of the use of the diffusion barrier layer, the HALO implantation dosage is smaller than the conventional dosage, thus any of the above-mentioned sequences will not cause bad influence to the device performance, which increases the process flexibility.

Figure 11:
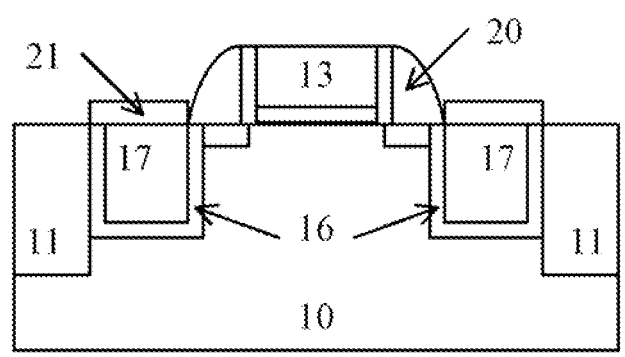

Then, a metal silicide 21 is formed as source/drain contacts, as shown in FIG. 11. The material of the metal silicide 21 is, for example, NiSi, NiSiGe, TiSi, TiSiGe.

Subsequently, a gate-last process is performed. The gate-last process include removing the previously formed polysilicon gate 13 so as to form a gate cavity, and then filling the gate cavity with a metal like Al, W, Ti and Ta so as to form a metal gate (not shown). After finishing the metal gate, the subsequent processes like copper-connection are performed. Although the gate-last process is described in the embodiment of the present invention, the use of a gate-first process is not excluded from the present invention, that is, after forming the high-K gate insulating layer 12, a gate of a metal material can be directly formed.

Thus, the present invention provides a manufacturing method for a semiconductor device having epitaxial source/drain regions, in which a diffusion barrier layer made of epitaxial silicon-carbon or germanium silicon-carbon are added on the basis of epitaxially growing germanium-silicon of the source/drain regions in the prior art process, and the introduction of the diffusion barrier layer prevents diffusion of the dopant in the source/drain regions, thus mitigating the SCE and DIBL effects. The use of the diffusion barrier layer can also reduce the dosage of HALO implantation in the subsequent step, thus if HALO is performed before epitaxial growth of the source/drain, impact on the surfaces of the source/drain regions can be alleviated; if HALO is performed after epitaxial growth of the source/drain, the stress release effect of the epitaxial layer of the source drain/regions caused by the implantation can be reduced as much as possible.

The above text describes the present invention in conjunction with the embodiments of the invention. However, these embodiments are only for the purpose of illustration instead of limiting the scope of the invention. The scope of the present invention is defined by the attached claims and their equivalents. Those skilled in the art can may various substitutions and modifications without departing from the scope of the present invention, so such substitutions and modifications shall fall within the scope of the present invention.

What is claimed is:

1. A semiconductor device manufacturing method for manufacturing a transistor having epitaxially grown source/drain, wherein said method comprises the steps of:
    providing a semiconductor substrate with an STI structure and performing a well region implantation;
    forming a gate insulating layer and a gate to defining a gate pattern;
    forming a dummy spacer covering a sidewall of the gate;
    forming a trench in a source/drain region;
    growing a diffusion barrier layer epitaxially in the source/drain region on all of the sidewalls and a bottom of the trench;

growing source/drain epitaxially on the diffusion barrier layer so that the diffusion barrier layer surrounds the sides and bottom of the source/drain, so as to provide stress to a channel region of the transistor;

forming a source/drain spacer; and forming metal silicides on the source/drain as contacts to the source/drain.

2. The method according to claim 1, wherein the diffusion barrier layer is formed by directly epitaxially growing silicon-carbon (Si:C) or germanium silicon-carbon (SiGe:C), or by growing an epitaxial silicon buffer layer first and then growing silicon-carbon (Si:C) or germanium silicon-carbon (SiGe:C).

3. The method according to claim 1, wherein the trenches are formed by dry etching, wet etching or a combination of both.

4. The method according to claim 1, wherein after forming the gate pattern and before growing the source/drain epitaxially, a LDD doping is performed, without performing a HALO process, or performing a HALO process with a smaller dosage than that of a conventional HALO process.

5. The method according to claim 1, wherein the diffusion barrier layer is used for preventing diffusion of phosphor ions implanted into the source/drain region for a NMOS.

6. The method according to claim 1, wherein the diffusion barrier layer is used for preventing diffusion of boron ions implanted into the source/drain region for a PMOS.

7. The method according to claim 1, wherein after forming a source/drain spacer, performing annealing processing to the semiconductor substrate.

8. The method according to claim 1, wherein the diffusion barrier layer had a thickness of 1 Å-300 Å.

9. The method according to claim 8, wherein the thickness of the diffusion barrier layer is preferably 10 Å-100 Å.

10. The method according to claim 1, wherein the diffusion barrier layer includes material of silicon-carbon (Si:C) or germanium silicon-carbon (SiGe:C).

11. The method according to claim 9, wherein the carbon in the diffusion barrier layer has a doping concentration of 1e12 $cm^{-3}$-1e22 $cm^{-3}$.

12. The method according to claim 11, wherein the carbon in the diffusion barrier layer is 5e19 $cm^{-3}$.

13. The method according to claim 1, wherein the gate includes a polysilicon material, and forming a gate insulating layer and a gate includes a gate-last process, after forming the metal silicide, removing the gate of the polysilicon material to form a gate cavity that is filled with metal to form a metal gate.

14. The method according to claim 13, wherein the semiconductor device manufacturing method is applicable to an integrated process of gate-first and gate-last of high-K/metal gate.

15. The method according to claim 1, wherein forming a gate insulating layer and a gate includes a gate-first process, and wherein the gate includes a metal material.

16. The method according to claim 15, wherein the semiconductor device manufacturing method is applicable to an integrated process of gate-first and gate-last of high-K/metal gate.

17. The method according to claim 1, wherein after epitaxially growing the source/drain and before forming the source/drain spacer, a LDD doping is performed, and a HALO process with a smaller dosage than that of a conventional HALO process is performed.

18. The method according to claim 17, wherein before performing the LDD doping, the dummy spacer is removed and an offset spacer is formed, thereby defining a LDD region.

19. The method according to claim 17, wherein before performing the LDD doping, the dummy spacer is used to define the LDD region without being removed.

20. The method according to claim 17, wherein when a HALO process with a smaller dosage than that of a conventional HALO process is performed, the dosage of the HALO process performed is smaller than 1e13 $cm^{-3}$.

* * * * *